United States Patent [19]

Kalfus

[11] Patent Number: 4,783,428
[45] Date of Patent: Nov. 8, 1988

[54] METHOD OF PRODUCING A THERMOGENETIC SEMICONDUCTOR DEVICE

[75] Inventor: Martin A. Kalfus, Scottsdale, Ariz.

[73] Assignee: Motorola Inc., Schaumburg, Ill.

[21] Appl. No.: 124,212

[22] Filed: Nov. 23, 1987

[51] Int. Cl.$^4$ ............................................. H01L 23/02
[52] U.S. Cl. ....................................... 437/209; 29/741;
29/827; 29/841; 264/272.13; 357/81; 437/211
[58] Field of Search ............... 437/209, 211, 217, 220;
357/81; 29/741, 739; 264/272.13

[56] References Cited

U.S. PATENT DOCUMENTS

| | | | |
|---|---|---|---|
| 4,209,799 | 6/1980 | Schierz et al. | 357/81 |
| 4,410,927 | 10/1983 | Butt | 357/81 |
| 4,594,770 | 6/1986 | Butt | 437/220 |

Primary Examiner—Brian E. Hearn
Assistant Examiner—Beverly Ann Pawlikowski
Attorney, Agent, or Firm—Raymond J. Warren; Joe E. Barbee

[57] ABSTRACT

A method is described for coupling the leadframe of a thermogenetic semiconductor device to a heatsink. This method consists of screening a first layer of thermally conductive epoxy on the heatsink. The first layer is cured and a second layer is screened on the first layer. The leadframe is then deposited on the second layer and the second layer is cured. The device then goes to encapsulation and final processing.

11 Claims, 5 Drawing Sheets

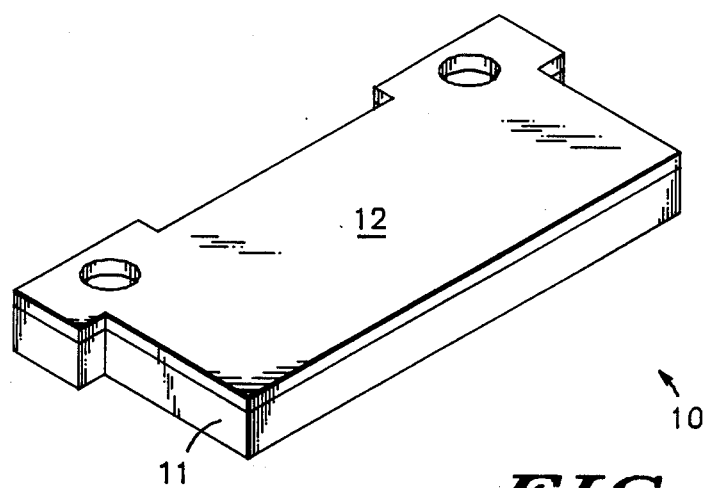
FIG. 1
—PRIOR ART—
FIG. 2
—PRIOR ART—
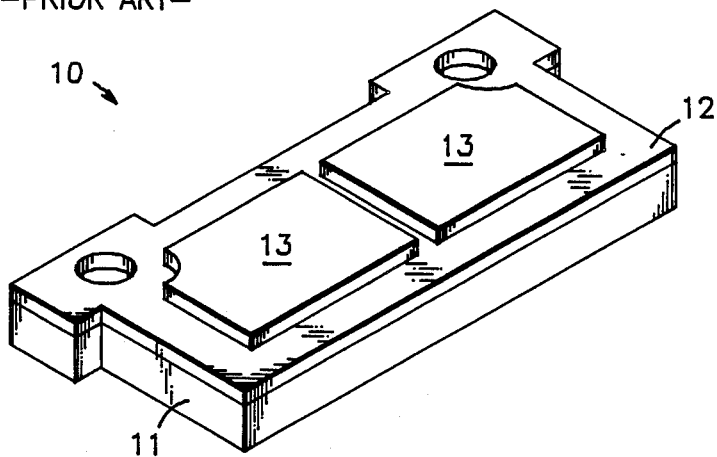

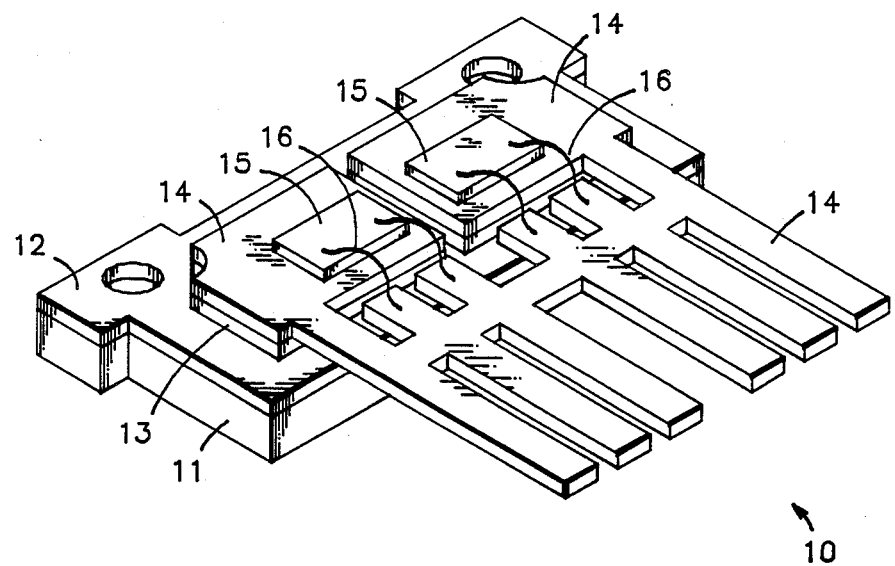
FIG. 3
—PRIOR ART—
FIG. 4
—PRIOR ART—
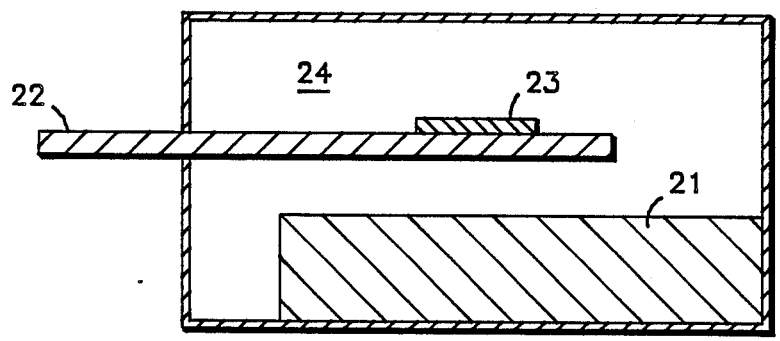

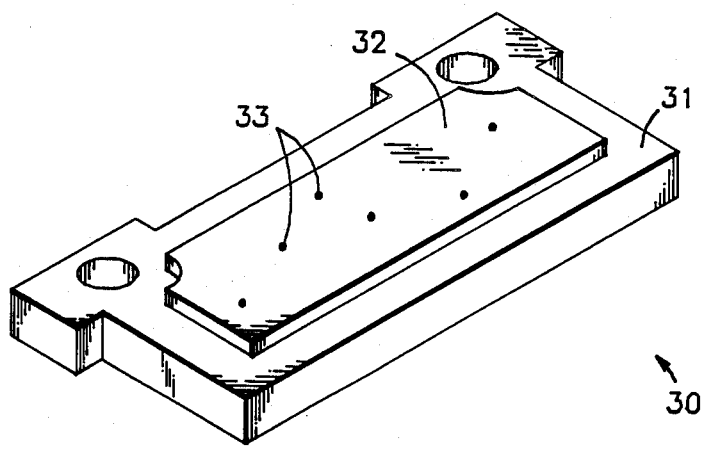
FIG. 5
FIG. 6
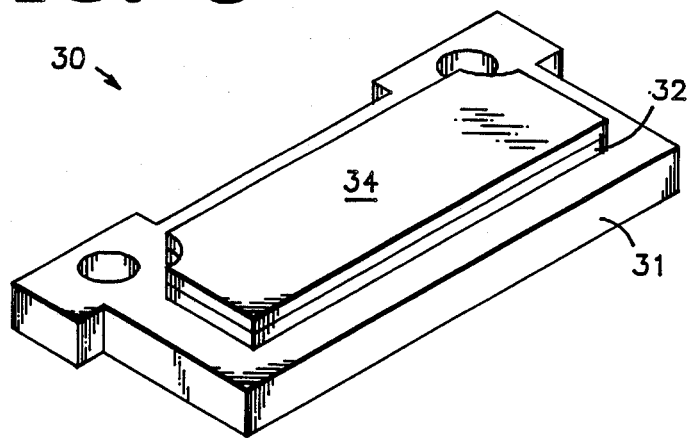

METHOD OF PRODUCING A THERMOGENETIC SEMICONDUCTOR DEVICE

BACKGROUND OF THE INVENTION

The present invention relates, in general, to a method of producing a thermogenetic semiconductor device and, more particularly, to the use of a two layer epoxy for attaching a leadframe of the thermogenetic semiconductor device to a heatsink.

Since thermogenetic semiconductor die, such as high current transistor devices, create heat while operating, heatsinks are required to dissipate the heat. In attaching the leadframe of a thermogenetic semiconductor device to a heatsink, several characteristics must be considered. Those characteristics are: the actual attachment, heat dissipation, and electrical isolation. Several methods are known in the art for providing such attachment. One of the prior art methods utilizes a laminated layer placed on the heatsink with copper pads placed on the laminated layer. The leadframe is then attached to the copper pads. While the thermal and electrical characteristics of this type of attachment are sufficient, the costs are prohibitive.

A second method of attaching a leadframe to a heatsink is the process of holding the leadframe in a spaced apart relation to the heatsink during plastic encapsulation. The disadvantages to this process are the mechanical difficulties in securing the leadframe and heatsink in a mold press during encapsulation and in the poor thermal properties of the plastic.

Accordingly, it is an object of the present invention to provide an apparatus and method of producing a thermogenetic semiconductor device that overcomes the above deficiencies.

A further object of the present invention is to provide an apparatus and method of producing a thermogenetic semiconductor device which is economical.

Another object of the present invention is to provide an apparatus and method of producing a thermogenetic semiconductor device that provides electrical isolation.

Still another object of the present invention is to provide an apparatus and method of producing a thermogenetic semiconductor device that provides thermal conductivity.

Yet another object of the present invention is to provide an apparatus and method of producing a thermogenetic semiconductor device which allows for pressure to be exerted during bonding.

SUMMARY OF THE INVENTION

A particular embodiment of the present invention consists of screening a first layer of thermally conductive epoxy on a heatsink and curing. Next, a second layer of thermally conductive epoxy is screened on the first layer to fill the voids in the first layer and to attach the leadframe. Finally, the leadframe is disposed on the second epoxy layer and the second epoxy layer is cured, thereby coupling the leadframe to the heatsink.

BRIEF DESCRIPTION OF THE DRAWINGS

FIGS. 1-3 are assembly flow diagrams illustrating a thermogenetic semiconductor device utilizing a prior art attachment method;

FIG. 4 is a cross sectional view of a thermogenetic semiconductor device utilizing a second prior art attachment method;

FIGS. 5-8 are assembly flow diagrams illustrating a thermogenetic semiconductor device embodying the attachment method of the present invention.

DETAILED DESCRIPTION OF THE DRAWINGS

Figure 7:
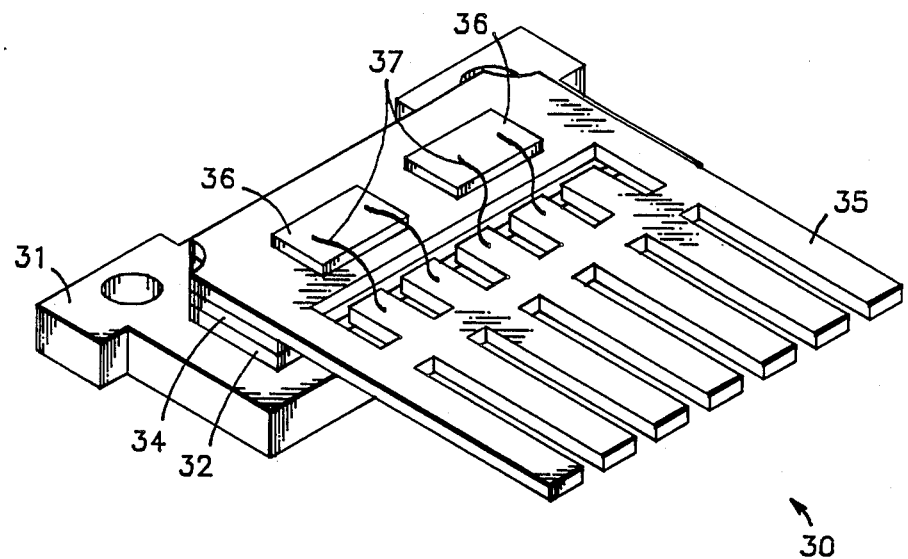

Referring initially to FIGS. 1-3, assembly flow diagrams of a thermogenetic semiconductor device, generally designated 10, utilizing a prior art attachment method are illustrated. FIG. 1 shows a heatsink 11, made of aluminum or the like, having an epoxy laminated layer 12. In general, laminate 12, consisting of a thin copper layer intimately bonded to a thermally enhanced epoxy, is placed on a substrate of heatsink material. Next copper pads 13 are etched from the copper layer. Heatsink 11 is then stamped from the substrate forming device 10 shown in FIG. 2. Copper pads 13 are used to provide thermal contact to laminate 12. With the use of copper pads 13 a leadframe 14 can be attached with a solder paste or the like. This is illustrated in FIG. 3. Preattached to leadframe 14 are die 15. Die 15 are attached directly to leadframe 14 by a die attach material and indirectly by wire bonds 16. This type of device, while providing the desired electrical and thermal characteristics, is not economical to use.

In FIG. 4, a cross sectional view of a thermogenetic semiconductor device, generally designated 20, utilizing a second prior art attachment method is illustrated. Device 20 is formed of a heatsink 21 and a leadframe 22 having a die 23 disposed thereon. Device 20 is then packaged in plastic 24. To produce device 20, heatsink 21 and leadframe 22 are placed in a mold in a spaced apart relation. Plastic or the like is then injected into the mold forming plastic package 24. The difficulties here are in the processing and in the resulting thermal characteristics. It is difficult to maintain a consistent spaced relation between heatsink 21 and leadframe 22 during encapsulation. In addition, the plastic does not provide the thermal characteristics required in many of the power type devices now in production.

Referring now to FIGS. 5-8, assembly flow diagrams of a thermogenetic semiconductor device, generally designated 30, embodying the present invention are illustrated. In FIG. 5, a first screen printed epoxy layer 32 is deposited on a heatsink 31. Layer 32 is approximately 1 to 2 mils thick and is composed of an epoxy that is electrically nonconductive and contains fillers with high thermal conductivity related to the epoxy. Layer 32 is then cured to provide a pedestal which will allow pressure to be exerted during the clamping process, when the leadframe is clamped to the heatsink.

It is not unusual for some small voids 33 to result when epoxy layer 32 is cured. Voids 33, while small, can degrade the conductive isolation of the final device. To rectify this, and to bond leadframe 35 to heatsink 31, a second epoxy layer 34 is screened on first epoxy layer 32, FIG. 6. Second layer 34 will fill the voids in layer 32 and bond leadframe 35 to heatsink 31 via layer 32. Epoxy layer 34 is of the same thermally conductive composition as layer 32 and is screened on at a thickness of approximately 1 to 2 mills.

As shown in FIG. 7, leadframe 35 has been previously die bonded, with die 36, and wire bonded, with wires 37. Once leadframe 35 is clamped to heatsink 31, second epoxy layer 34 is totally cured. The clamping is permitted because layer 32 maintains a separation between leadframe 35 and heatsink 31.

Figure 8:
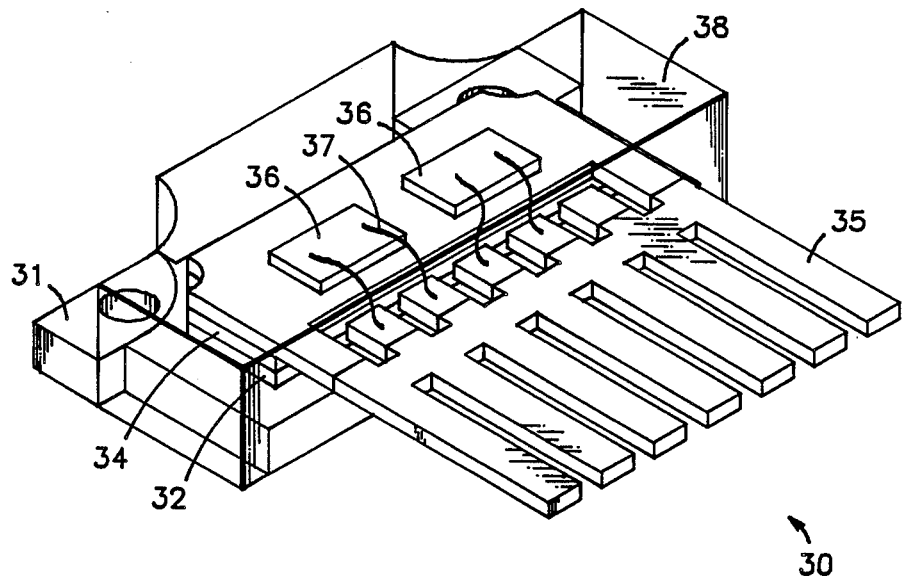

Following the attachment, the device 30 is packaged. One packaged device is shown in FIG. 8. Leadframe 35 and heatsink 31 are shown partially encapsulated in plastic 38. Next, the leadframe is trimmed to remove the interconnects and define the leads.

Figure 9:
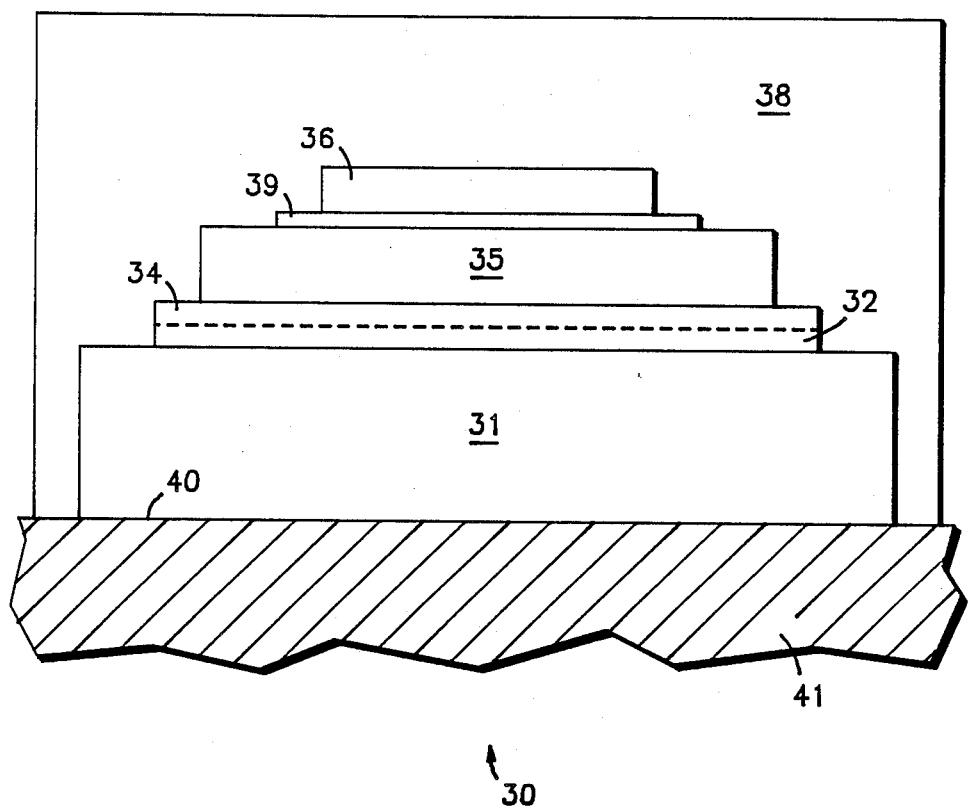
FIG. 9 is a cross sectional view of the thermogenetic semiconductor device embodying the attachment method of the present invention.

In FIG. 9 a cross sectional view of a thermogenetic semiconductor device embodying the attachment method of the present invention is illustrated. In FIG. 9, items similar to the items of FIG. 8 have been provided with the same numbers. Device 30 consists of die 36 being coupled to leadframe 35 by a die attach solder 39. Leadframe 35 is then attached to heatsink 31 by two layers of epoxy 32 and 34. Device 30, with the exception of a base 40 of heatsink 31, is then encapsulated in plastic 38. Base 40 of heatsink 31 is left exposed so that device 30 may be mounted on an exterior heatsink 41.

This type of attachment provides high efficiency thermal characteristics and electrical isolation more economically than other methods known in the art.

Thus, it will be apparent to one skilled in the art that there has been provided, in accordance with the invention, a device and method that fully satisfies the objects, aims, and advantages set forth above.

While the invention has been described in conjunction with specific embodiments thereof, it will be evident that many alterations, modifications, and variations will be apparent to those skilled in the art in light of the foregoing description. Accordingly, it is intended to embrace all such alterations, modifications, and variations in the appended claims.

I claim:

1. A method of producing a thermogenetic semiconductor device comprising the steps of:
    providing a heatsink;
    depositing a first layer of epoxy on said heatsink;
    curing said first layer of epoxy;
    depositing a second layer of epoxy on said first layer of epoxy;
    depositing a leadframe on said second layer of epoxy; and
    curing said second layer of epoxy.

2. The method of claim 1 wherein a thermogenetic semiconductor die is coupled to said leadframe.

3. The method of claim 2 further comprising the step of encapsulating said heatsink, first and second layers of epoxy, leadframe, and thermogenetic semiconductor die in a package.

4. The method of claim 1 wherein said first and second layers of epoxy are thermally conductive.

5. The method of claim 1 wherein said first and second layers of epoxy are approximately between 1 and 2 mills thick.

6. A method of producing a thermogenetic semiconductor device comprising the steps of:
    providing a heatsink;
    depositing a first layer of thermally conductive epoxy on said heatsink;
    curing said first layer of thermally conductive epoxy;
    depositing a second layer of thermally conductive epoxy on said first layer of thermally conductive epoxy;
    depositing a leadframe on said second layer of thermally conductive epoxy; and
    curing said second layer of thermally conductive epoxy.

7. The method of claim 6 wherein a thermogenetic semiconductor die is coupled to said leadframe.

8. The method of claim 7 further comprising the step of encapsulating said heatsink, first and second layers of thermally conductive epoxy, leadframe, and thermogenetic semiconductor die in a package.

9. The method of claim 6 wherein said first and second layers of epoxy are approximately between 1 and 2 mills thick.

10. A method of producing a thermogenetic semiconductor device comprising the steps of:
    providing a heatsink;
    depositing a first layer of thermally conductive epoxy on said heatsink;
    curing said first layer of thermally conductive epoxy;
    depositing a second layer of thermally conductive epoxy on said first layer of thermally conductive epoxy;
    depositing a leadframe having a thermogenetic semiconductor die coupled thereto on said second layer of thermally conductive epoxy;
    curing said second layer of thermally conductive epoxy; and
    encapsulating said heatsink, first and second layers of thermally conductive epoxy, leadframe, and thermogenetic semiconductor die in a package.

11. The method of claim 10 wherein said first and second layers of epoxy are approximately between 1 and 2 mills thick.

* * * * *